United States Patent [19]
Yasui et al.

[11] Patent Number: 5,162,667
[45] Date of Patent: Nov. 10, 1992

[54] SEMICONDUCTOR INTEGRATED CIRCUIT WITH MASTER AND SLAVE LATCHES

[75] Inventors: Ikuo Yasui; Toru Kengaku; Eiichi Teraoka, all of Itami, Japan

[73] Assignee: Mitsubishi Denki Kabushiki Kaisha, Japan

[21] Appl. No.: 610,179

[22] Filed: Nov. 7, 1990

[30] Foreign Application Priority Data
Nov. 13, 1989 [JP] Japan ................... 1-295704

[51] Int. Cl.⁵ ................................. H03K 3/289
[52] U.S. Cl. .......................... 307/272.2; 307/269; 307/272.1
[58] Field of Search ............. 307/269, 272.2, 290, 307/291, 272.1

[56] References Cited

U.S. PATENT DOCUMENTS

| | | | |
|---|---|---|---|
| 4,456,837 | 6/1984 | Schade, Jr. | 307/269 |
| 4,691,122 | 9/1987 | Schnizlein et al. | 307/272.2 |
| 4,705,965 | 11/1987 | Stuyt | 307/272.2 |
| 4,970,407 | 11/1990 | Patchen | 307/272.2 |

*Primary Examiner*—Janice A. Howell
*Assistant Examiner*—Terry D. Cunningham
*Attorney, Agent, or Firm*—Townsend and Townsend

[57] ABSTRACT

A semiconductor integrated circuit of master and slave latches and the like that reduces power consumption by supplying a second clock which is a synchronous with a first clock to a slave latch only when the first clock that determines the latch period is supplied to a master latch, discontinuing the supply of the second clock after the master latch completes its latch action in the case that the supply of the first clock to the master latch is discontinued, and discontinuing the supply of clocks when latch action is not required, to reduce loads connected to them.

8 Claims, 6 Drawing Sheets

SEMICONDUCTOR INTEGRATED CIRCUIT WITH MASTER AND SLAVE LATCHES

BACKGROUND OF THE INVENTION

1. Field of the Invention

This invention relates to a semiconductor integrated circuit that controls latch operations of plural latch circuits, by plural synchronous signals and more particularly to a semiconductor integrated circuit in which a latch circuit is composed of a master latch and a slave latch.

2. Description of Related Art

Figure 1:
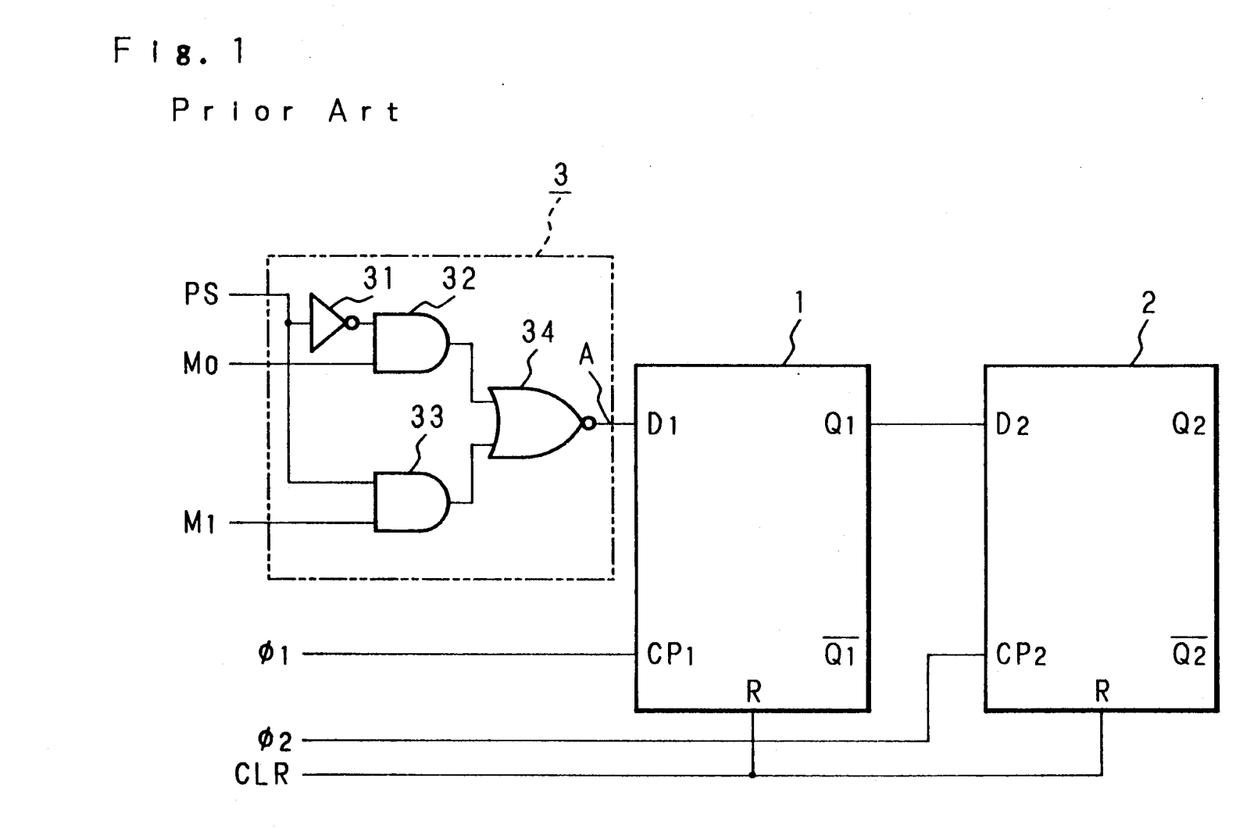
FIG. 1 is a circuit diagram showing the structure of conventional master and slave latch circuits.

FIG. 1 shows a circuit diagram of structures of master latch and slave latch of a conventional semiconductor integrated circuit which was presented in IEEE JOURNAL OF SOLIDSTATE CIRCUIT, Vol. SC-22, No. 4, Aug., 1987 "A ScarceState-Transition Viterbi-Decorder VLSI for Bit Error Correction" pp. 578. Numeral 1 in the figure shows a master latch, and an output terminal $Q_1$ of the master latch 1 is connected to a data terminal $D_2$ of a slave latch 2. A synchronous signal, first clock $\phi_1$, is applied to a clock terminal $CP_1$ of the master latch 1, and a synchronous signal, second clock $\phi_2$, which does not overlap the first clock $\phi_1$, to a clock terminal $CP_2$ of the slave latch 2, respectively. A clear signal $\overline{CLR}$ is applied to a reset terminal R of the master latch 1 and the slave latch 2, and when it is "L", the master latch 1 and the slave latch 2 are reset. An output from a logic circuit 3 is applied to a data terminal $D_1$ of the master latch 1.

The logic circuit 3 comprises an inverter 31 to which a control signal PS is applied, an AND gate 32 to which the output of inverter 31 and a control signal $M_0$ are applied, an AND gate 33 to which control signals PS and $M_1$ are applied and a NOR gate 34 to which the outputs of AND gates 32 and 33 are applied. An output data A of the NOR gate 34 is applied to the data terminal $D_1$ of the master latch 1. The truth table of outputs of the logic circuit 3 is shown as in Table 1.

TABLE 1

| $M_0$ | $M_1$ | PS | A |
|---|---|---|---|
| 0 | 0 | 0 | 1 |
|   |   | 1 | 1 |
| 0 | 1 | 0 | 1 |
|   |   | 1 | 0 |
| 1 | 0 | 0 | 0 |
|   |   | 1 | 1 |
| 1 | 1 | 0 | 0 |
|   |   | 1 | 0 |

Operations of conventional master and slave latch circuits composed in such manner are described below.

Figure 2:
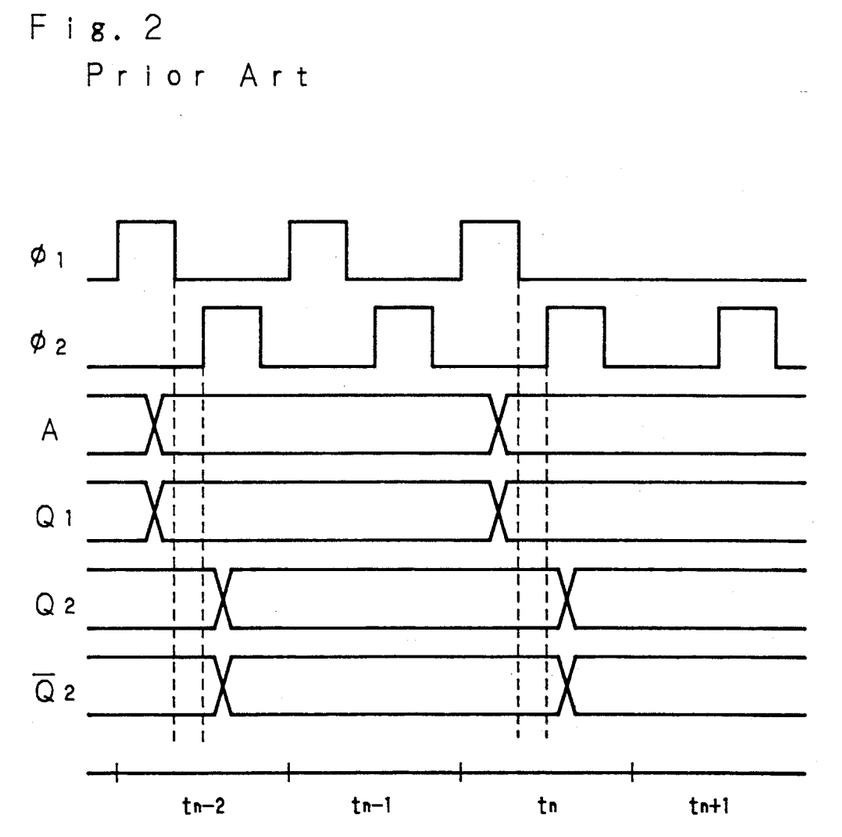
FIG. 2 is a timing chart showing their operation.

FIG. 2 is a timing chart showing operations of master and slave latch circuits. In order to describe general latch operations, suppose the clear signal $\overline{CLR}$="H" here.

As shown in FIG. 2, if the output data A of the logic circuit 3 has changed before the first clock $\phi_1$ changes from "H" to "L", the output data A is latched by the master latch 1 until the first clock $\phi_1$ changes from "H" to "L". In succession, when the second clock $\phi_2$ changes from "L" to "H", data from the output terminal $Q_1$ of the master latch 1 is sent to the slave latch 2. This further becomes changes of output data from the output terminals $Q_1$ and $\overline{Q_2}$ of the slave latch 2. After the changes, the second clock $\phi_2$ changes from "H" to "L", and the conditions do not change until the changed output data of the master latch 1 is sent to the slave latch 2.

In the conventional master and slave latches shown in FIG. 1, in the case that it is not required to feed data to the master latch 1, the first clock $\phi_1$ generally maintains the disable state, that is, the logic "L" state, as shown in FIG. 2. Generally, the first clock $\phi_1$ is generated by a logical product of an enable signal, not shown, which operates the latch circuit and a clock, and thus the disable state is maintained. Here supposing the first clock $\phi_1$ comes to be disabled after the time $(t_{n+1})$ as shown in FIG. 2, the output data of the master latch 1 does not change from the state of the time $(t_n)$ after the time $(t_{n+1})$. In such case, although the second clock $\phi_2$ which is supplied to the slave latch 2 is not required, it is continuously supplied.

In a semiconductor integrated circuit, specifically that of microprocessors and the like, although there are generally plural master and slave latch circuits in shapes of register array and counter, new data is not always inputted to all the master latches. In the case that it is not required to input new data to a master latch, data from the master latch is not required to be inputted to the slave latch connecting to the master latch.

However, in conventional master and slave latch circuits, even in the case that data is not required to be inputted, the second clock is continuously supplied to the slave latch. Since the power consumption of a semiconductor integrated circuit depends on the current that charges or discharges a load capacity, when the first clock is not supplied to a master latch, the load connected to the first clock that controls the master latch is reduced, and thereby the operating power consumption of a circuit that generates the first clock is reduced. However, in conventional master and slave latch circuits, as the second clock is continuously supplied to all the slave latches, the load connected to the second clock that controls the slave latch does not change, thereby wastefully consuming the power in the circuit that generates the second clock. This has been a problem of obstructing to lower the power consumption of semiconductor integrated circuits.

SUMMARY OF THE INVENTION

This invention was devised in the light of such problems, and it is hence a primary object of the invention to present a semiconductor integrated circuit that can reduce loads connected to two different clocks by controlling not only the first clock which is a first synchronous signal applied to a master latch but also the second clock which is a second synchronous signal applied to a slave latch to enable or disable according to the enable or disable state of the first clock, thereby, to reduce the power consumption.

The other object of the invention is to present a semiconductor integrated circuit in which its second control means correctly completes latch operations of the second latch circuit by discontinuing supply of the second clock after the completion of latch operations of the second latch circuit.

In the invention, the second synchronous signal is supplied to the second latch circuit by the second control means only when the first synchronous signal is supplied to the first latch circuit by the first control means, and when the supply of the first synchronous signal to the first latch circuit is discontinued, the supply of the second synchronous signal to the second latch circuit is discontinued. Therefore, in the case that operations of the first latch circuit is not required, as loads connected to the first and second synchronous signals decrease, the power consumption is reduced.

The above and further objects and features of the invention will more fully be apparent from the following detailed description with accompanying drawings.

DESCRIPTION OF THE PREFERRED EMBODIMENTS

One of the embodiments of the invention is described in details below referring now to the drawings.

Figure 3:
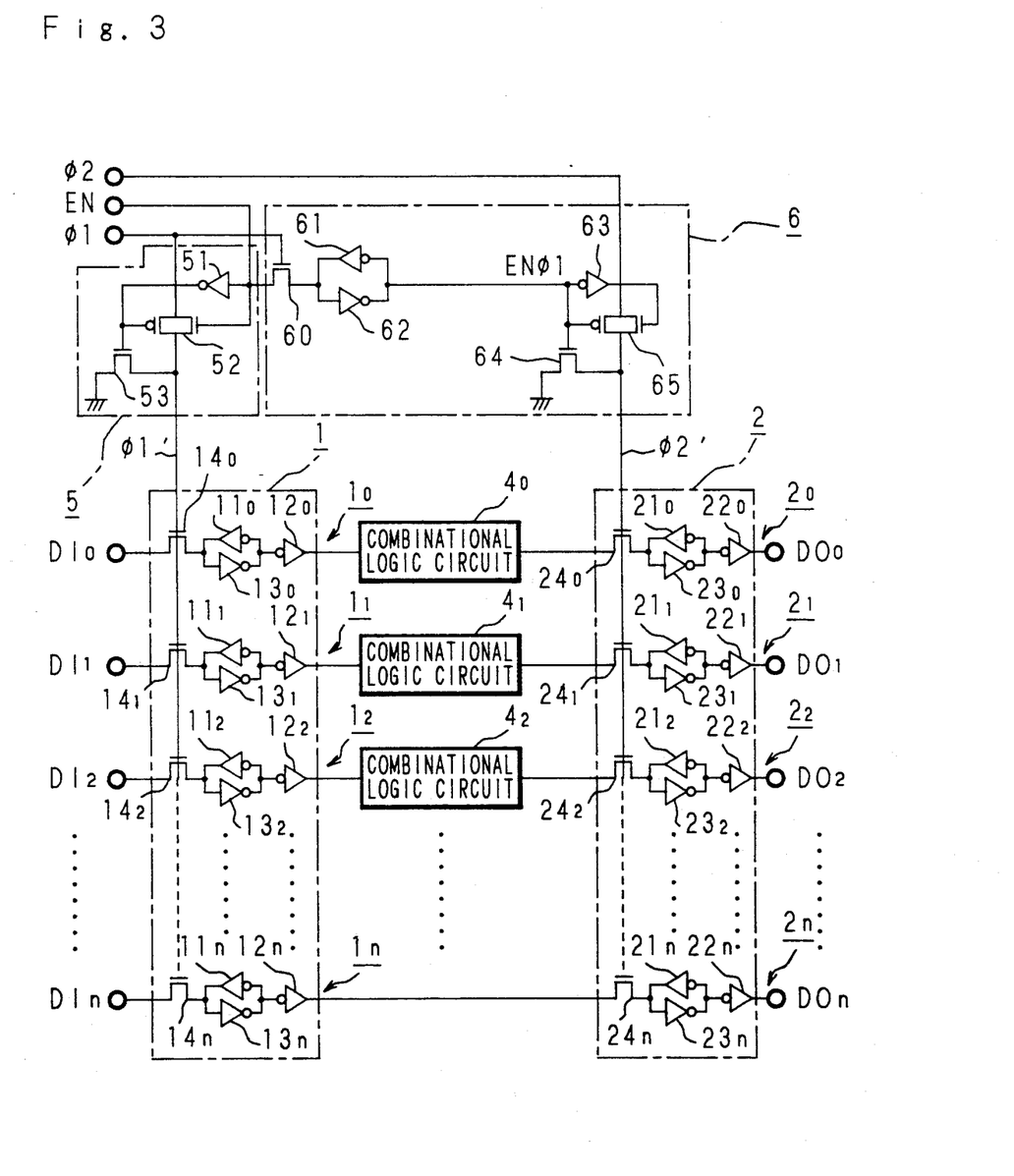
FIG. 3 is a circuit diagram showing the structure of master and slave latch circuits, which is a semiconductor integrated circuit related to the invention.

Numeral 1 in FIG. 3 shows a master latch which comprises latches $1_i$ ($i=0$ to n) of (n+1) stages. An input data $DI_i$ inputted to each of the latches $1_i$ is applied to the source of an n-channel transistor $14_i$, from which it is applied to an inverter $12_i$ through two inverters $11_i$ and $13_i$ which are connected reversely in parallel. Output data of the inverter $12_i$ is applied to the slave latch 2 through a combinational logic circuit $4_j$ ($j=0$ to n−k) that performs various logical operations. The slave latch 2 comprises n+1 latches $2_i$ same as the master latch, each of which is composed of an N-channel transistor $24_i$, two inverters $21_i$ and $23_i$ which are connected reversely in parallel and an inverter $22_i$, and output data $DO_i$ is outputted from the inverter $22_i$.

In addition, the first (or second) control clock $\phi_1'$ (or $\phi_2'$) is applied to the gate of each of the N-channel transistors $14_i$ (or $24_i$) of the master latch 1 (or the slave latch 2) from the first (or second) control circuit 5 (or 6) which is the first (or second) control means. According to the clock "H" or "L", the input data $DI_i$ (or data from the combinational logic circuit $4_j$) is turned on/off.

The first control circuit 5 comprises an inverter 51, a transfer gate 52 and an N-channel transistor 53 grounded by the drain. An enable signal EN that operates master and slave latch circuits of the invention is applied to a P-channel side gate of the transfer gate 52 and the gate of N-channel transistor 53 through the inverter 51, and the enable signal EN is directly applied to an N-channel side gate of the transfer gate 52. The first clock $\phi_1$ which is a first synchronous signal is applied to a source of the transfer gate 52, where it is turned on/off and outputted as the first control clock $\phi_1'$ from the drain. The first control clock $\phi_1'$ outputted is applied to a source of the N-channel transistor 53 as well as to the gate of N-channel transistor $14_i$ as mentioned above. The first control circuit 5 outputs the logical product of the first clock $\phi_1$ and enable signal EN as the first control clock $\phi_1'$ with these elements.

A second control circuit 6 comprises an N-channel transistor 60, inverters 61 and 62 connected reversely in parallel, an inverter 63, N-channel transistor 64 grounded by the drain and a transfer gate 65. The enable signal EN is applied to the source of N-channel transistor 60, which is turned on/off by the first clock $\phi_1$ applied to the gate. Outputs from the N-channel transistor 60 are applied to the inverters 61 and 62, and the output data $EN\phi_1$ is applied to the P-channel side gate of the transfer gate 65 and the gate of the N-channel transistor 64 as well as to the inverter 63. An output of the inverter 63 is applied to the N-channel side gate of the transfer gate 65, and a second clock $\phi_2$ which is the second synchronous signal is applied to the input side of transfer gate 65. The second clock $\phi_2$ does not overlap the first clock $\phi_1$. The second control clock $\phi_2'$ generated by on/off control of the second clock $\phi_2$ is outputted from the transfer gate 65 and applied to the source of N-channel transistor 64 as well as to each of the N-channel transistors $24_i$ of the slave latch 2 as mentioned herein above.

The inverter 63, N-channel transistor 64 and transfer gate 65 of the second control circuit 6 are to output the logical product of the second clock $\phi_2$ and output data $EN\phi_1$ same as the first control circuit 5, and the N-channel transistor 60 and inverters 61 and 62 compose a latch and latch the enable signal EN at the timing of the clock $\phi_1$.

Figure 4:
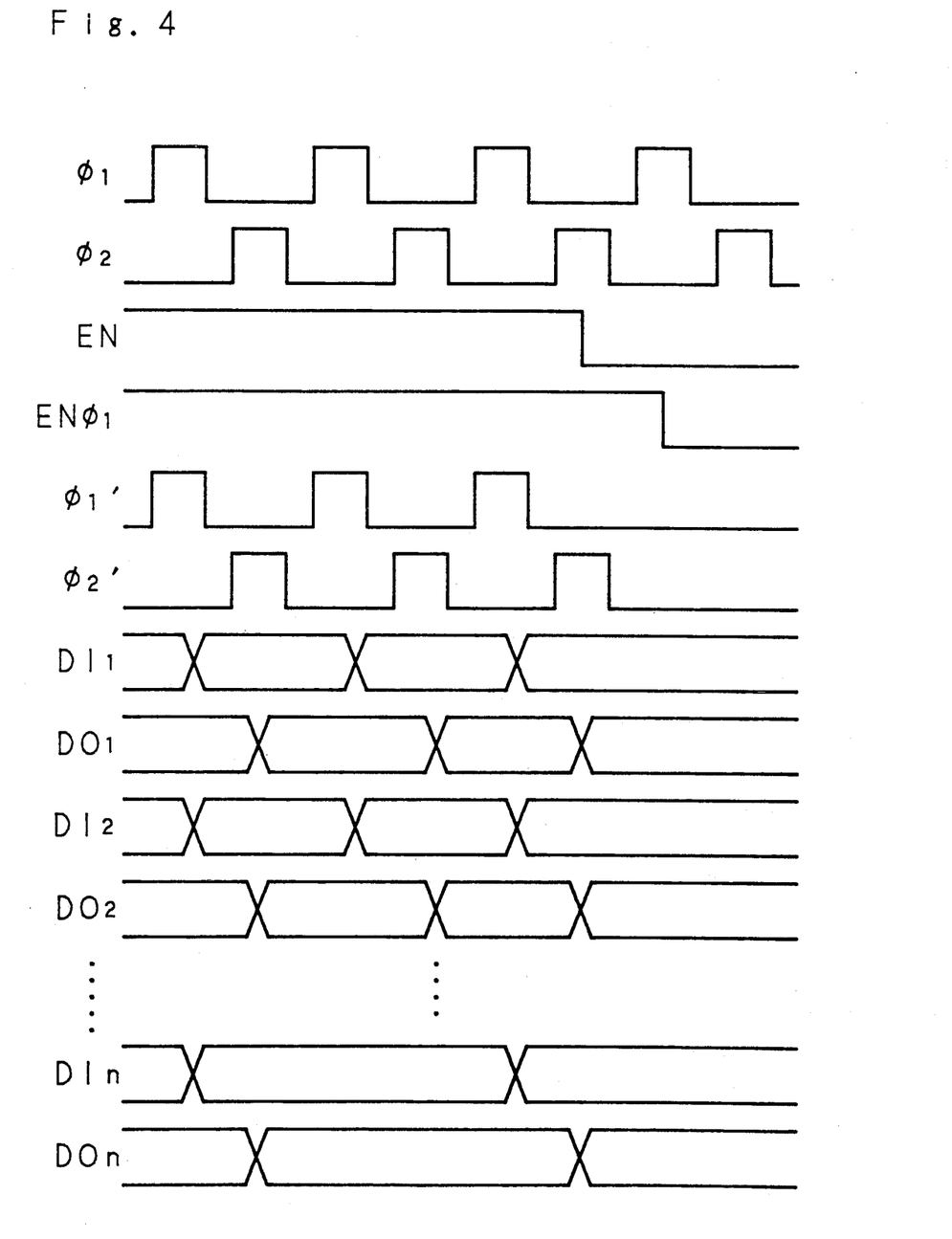
FIG. 4 is a timing chart showing its operation.

The operation of master and slave latch circuits of the invention structured in such manner is described below in succession. FIG. 4 is a timing chart showing the operation of master and slave circuits.

When the enable signal EN is "H" (=enable), as the transfer gates 52 and 65 are turned on and the N-channel transistors 53 and 64 are turned off, the first clock $\phi_1$ and the second clock $\phi_2$ are respectively outputted from the first control circuit 5 and second control circuit 6 directly as the first control clock $\phi_1$ and the second control clock $\phi_2$.

Therefore, if the input data $DI_i$ changes before the first clock $\phi_1$ changes from "H" to "L", the input data $DI_i$ is latched by each of the latches $1_i$ of the master latch 1 until the first clock $\phi_1$ changes from "H" to "L" after then. In succession, the second clock $\phi_2$ changes from "L" to "H", and the output data of the master latch 1 is sent to the slave latch 2 directly or through the combinational logic circuit $4_j$. The changes are outputted as output data $DO_i$ and held in the slave latch 2 even when the second clock $\phi_2$ changes from "H" to "L".

When the enable signal is "L" (=disable), succeedingly, the first control clock $\phi_1'$ and the second control clock $\phi_2'$ are always "L" regardless of the state "H" or "L" of the first clock $\phi_1$ and the second clock $\phi_2$, since both the first and the second clocks $\phi_1$ and $\phi_2$ are cut off by the first control circuit 5 and the second control circuit 6, and the N-channel transistors 53 and 64 are turned on and grounded.

It is to prevent the second control clock $\phi_2'$ from immediately changing to "L" and the slave latch 2 from operating in error when the enable signal EN changes until the second clock $\phi_2$ changes from "H" to "L" as shown in FIG. 4 that the latches are constructed by the N-channel transistor 60 and inverters 61 and 62. In other words, by latching the enable signal EN by the first clock $\phi_1$, the output data $EN\phi_1$ does not change to "L" until the first clock $\phi_1$ changes to "H" in succession. As the second control clock $\phi_2'$ is produced by the logical product of the output data $EN\phi_1$ and the second clock $\phi_2$, the second control clock $\phi_2'$ comes to be "L" after the slave latch 2 correctly latches the output of the master latch 1.

Succeedingly, another embodiment of the invention is described in detail.

Figure 5:
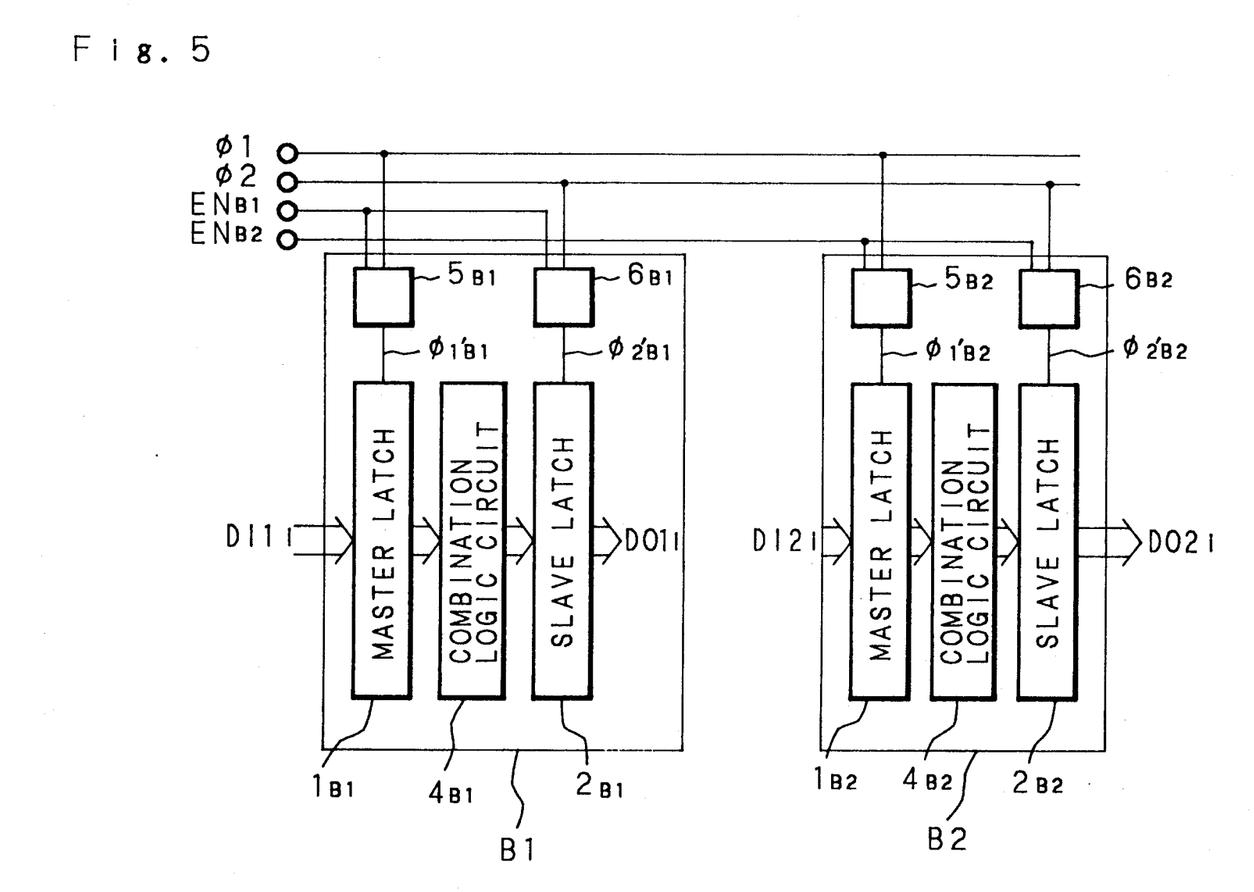
FIG. 5 is a block diagram showing the structure of master and slave latch circuits of another embodiment.

FIG. 5 is a block diagram showing the structure of semiconductor integrated circuit of another embodiment. In the embodiment, master and slave latch circuits having the same structure as of the first embodiment are employed in blocks B1 and B2, and enable signals $EN_{B1}$ and $EN_{B2}$ are respectively supplied to the first control circuits $5_{B1}$ and $5_{B2}$ and the second control circuits $6_{B1}$ and $6_{B2}$ of the blocks B1 and B2. In addition, the first clock $\phi_1$ is applied to the first control circuits $5_{B1}$ and $5_{B2}$, and the first clock $\phi_1$ and a non-overlapping second clock $\phi_2$ to the second control circuits $6_{B1}$ and $6_{B2}$, respectively.

The first control clocks $\phi_{1'B1}$ and $\phi_{1'B2}$ are applied respectively to master latches $1_{B1}$ and $1_{B2}$ from the first control circuits $5_{B1}$ and $5_{B2}$, and the second control clocks $\phi_{2'B1}$ and $\phi_{2'B2}$ to slave latches $2_{B1}$ and $2_{B2}$ from the second control circuits $6_{B1}$ and $6_{B2}$, respectively. Input data $DI1_i$ and $DI2_i$ inputted to the master latches $1_{B1}$ and $1_{B2}$, respectively, are separately outputted from the slave latches $2_{B1}$ and $2_{B2}$ through combinational logic circuits $4_{B1}$ and $4_{B2}$ as output data $DO1_i$ and $DO2_i$.

Figure 6:
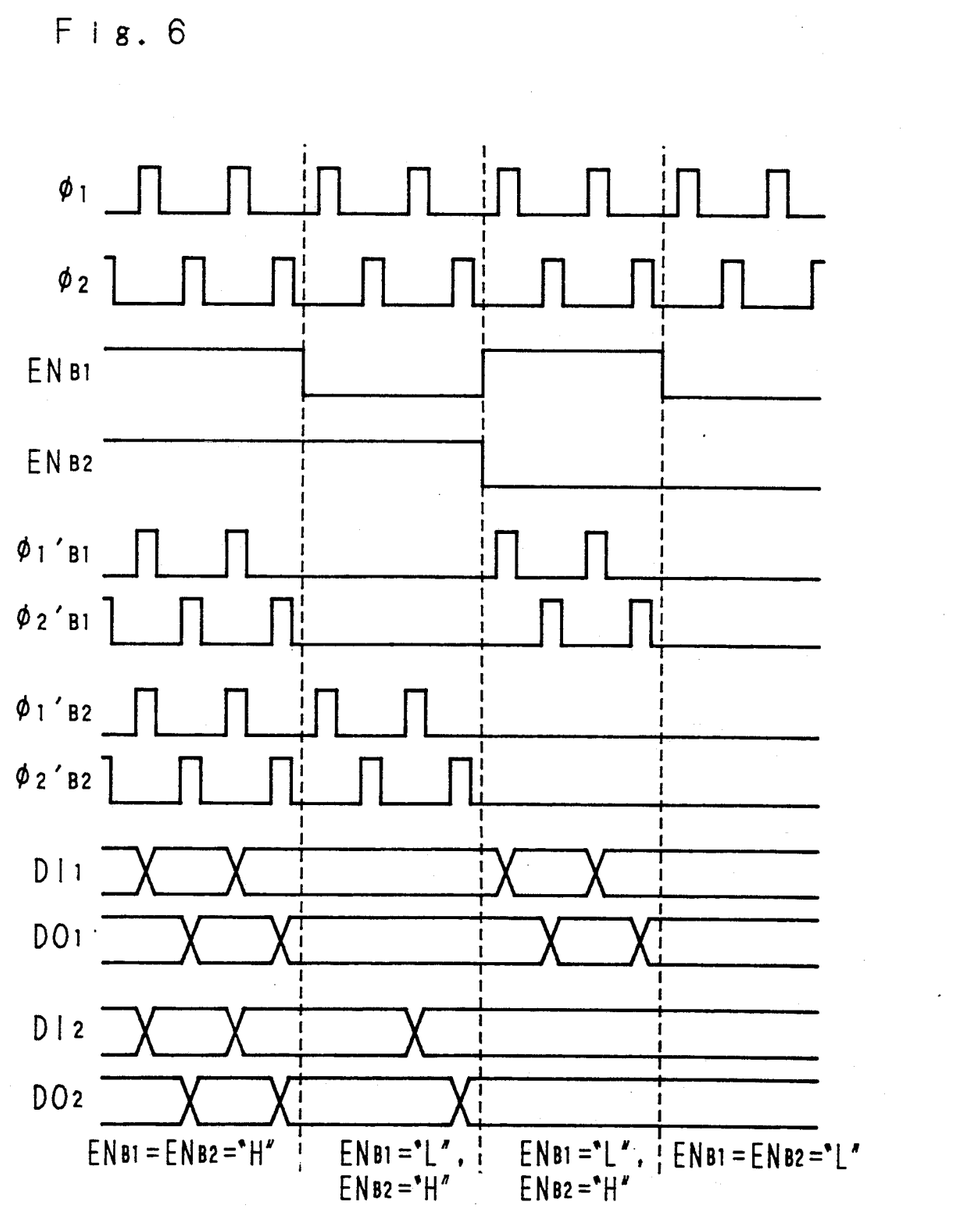
FIG. 6 is a timing chart showing its operation.

The operation of another embodiment constructed in such manner is described belows. FIG. 6 is a timing chart showing the operation of master and slave latch circuits of the other embodiment.

First of all, when both enable signals $EN_{B1}$ and $EN_{B2}$ are "H", (=enable), the first clock $\phi_1$ and the second clock $\phi_2$ are respectively applied to the master latches $1_{B1}$ and $1_{B2}$ and the slave latches $2_{B1}$ and $2_{B2}$ as the first control clocks $\phi_{1'B1}$ and $\phi_{1'B2}$ and the second control clocks $\phi_{2'B1}$ and $\phi_{2'B2}$ through the first control circuits $5_{B1}$ and $5_{B2}$ and the second control circuits $6_{B1}$ and $6_{B2}$. Therefore, the respective master latches $1_{B1}$ and $1_{B2}$ and slave latches $2_{B1}$ and $2_{B2}$ of the blocks B1 and B2 are in ON-state.

In the case that the enable signal $EN_{B1}$ is "L" (=disable) and the enable signal $EN_{B2}$ is "H", respectively, the first clock $\phi_1$ and the second clock $\phi_2$ are respectively, shut off by the first control circuit $5_{B1}$ and the second control circuit $6_{B1}$, in the block B1, and the first control clock $\phi_{1'B1}$ and the second control clock $\phi_{2'B2}$ are always "L" regardless of the state "H" or "L" of the first and the second clocks $\phi_1$ and $\phi_2$. Thus, the master latch $1_{B1}$ and the slave latch $2_{B1}$ are not in action, and the data is continuously maintained. On the other hand, in the block B2, as the first and the second clocks $\phi_1$ and $\phi_2$ are passed by the first and the second control circuits $5_{B2}$ and $6_{B2}$, the master latch $1_{B2}$ and the slave latch $2_{B2}$ come to be in action. Thereby, loads connected to the first clock $\phi_1$ and the second clock $\phi_2$ are reduced by the portion of the loads of the master latch $1_{B1}$ and the slave latch $2_{B1}$ the block B1 with the first clock $\phi_1$ and the second clock $\phi_2$ shut off.

In the case of enable signals $EN_{B1}$="H" and $EN_{B2}$="L", although the master latch $1_{B1}$ and the slave latch $2_{B1}$ of the block B1 are in action as well, as the master latch $1_{B2}$ and the slave latch $2_{B2}$ of the block B2 are not in action, and continuously maintain the data, loads connected to the first clock $\phi_1$ and the second clock $\phi_2$ are reduced by the portion of the load of block B2.

Moreover, in the case that both enable signals $EN_{B1}$ and $EN_{B2}$ are "L", neither blocks B1 nor B2 comes to be in action, and the master latches $1_{B1}$ and $1_{B2}$ and the slave latches $2_{B1}$ and $2_{B2}$ continuously hold the data. Therefore, loads connected to the first clock $\phi_1$ and the second clock $\phi_2$ are reduced by the portion of the loads of blocks B1 and B2.

Circuits of the two embodiments are examples of application, and it is obvious that compositions of latch circuits, control circuits and the like are not limited to them.

As described hereinabove, a semiconductor integrated circuit of lower power consumption can be obtained by the invention by means of controlling to shut off both the first synchronous signal of the first latch circuit requiring no data inputting and the second synchronous signal of the second latch circuit connecting to it to reduce loads connected to the first synchronous signal and the second synchronization that does not overlap the first synchronous signal, thereby, to reduce the power consumption of circuit which generates them.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A semiconductor integrated circuit that receives an externally supplied enable signal, and first and second synchronous signals, each said synchronous signal comprising a series of pulses equispaced in time where the pulses in the first synchronous signal do not overlap pulses in the second synchronous signal, said circuit comprising:
   a first latch circuit, that receives a first input, for latching said first input in response to a transition of a first control signal received at a control input thereof;
   a second latch circuit, that receives a second input derived from said first input latched by said first latch circuit, for latching said second input in response to a transition of a second control signal received at a second control input thereof;
   first control means, responsive to said first synchronous signal and said enable signal and having an output coupled to the control input of said first latch circuit, for providing said first control signal as pulses generated in synchronism with pulses in said first synchronous signal when said enable signal is asserted; and
   second control means, responsive to said enable signal and said first and second synchronous signals, and having an output coupled to the control input of said second latch circuit, for providing said second control signal as pulses generated in synchronism with said second synchronous signal only when said enable signal is asserted and following a transition of said first synchronous signal, and for providing said second control signal at a low level after said enable signal is negated and following a transition of said first synchronous signal.

2. A semiconductor integrated circuit as set forth in claim 1, wherein said first latch circuit is a master latch circuit, and said second latch circuit is a slave latch circuit.

3. A semiconductor integrated circuit as set forth in claim 1, wherein said first control means includes means for providing a logical product of said first synchronous signal and said enable signal as said first control signal.

4. A semiconductor integrated circuit as set forth in claim 3, wherein said second control means includes means for providing a third control signal and means for providing a logic product of said second synchronous signal and said third control signal as said second control signal.

5. A semiconductor integrated circuit that receives an externally supplied enable signal, and first and second synchronous signals, each said synchronous signal comprising a series of pulses equispaced in time where the pulses in the first synchronous signal do not overlap pulses in the second synchronous signal, said circuit comprising:
- a first latch circuit including a plurality of means, each receiving a respective input for latching said input in response to a transition of a first control signal received at a control input of each means;
- a second latch circuit including a plurality of means, each receiving an associated signal derived from a corresponding one of said inputs latched by said first latch circuit for latching said associated signal in response to a transition of a second control signal received at a control input of each means;
- first control means, responsive to a first synchronous signal and said enable signal and having an output coupled to the control inputs of said first latch circuit, for providing said first control signal as pulses generated in synchronism with pulses in said first synchronous signal when said enable signal in asserted; and
- second control means, responsive to said enable signal and said first and second synchronous signals and having an output coupled to the control inputs of said second latch circuit, for providing said second control signal as pulses generated in synchronism with said second synchronous signal only when said enable signal is asserted and following a transition of said first synchronous signal, and for providing said second control signal at a low level after said enable signal is negated and following a transition of said first synchronous signal.

6. A semiconductor integrated circuit as set forth in claim 5 wherein said first latch circuit is a master latch circuit and said second latch circuit is a slave latch circuit.

7. A semiconductor integrated circuit as set forth in claim 5 wherein said first control means includes means for providing a logical product of said first synchronous signal and said enable signal as said first control signal.

8. A semiconductor integrated circuit as set forth in claim 7 wherein said second control means includes means for providing a third control signal and means for providing a logical product of said second synchronous signal and said third control signal as said second control signal.

* * * * *